(12) United States Patent
Itagaki

(10) Patent No.: US 7,589,576 B2
(45) Date of Patent: Sep. 15, 2009

(54) PHASE SHIFTER AND PHASE SHIFT METHOD

(75) Inventor: Tomoari Itagaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 13 days.

(21) Appl. No.: 11/778,906

(22) Filed: Jul. 17, 2007

(65) Prior Publication Data

US 2008/0074163 A1   Mar. 27, 2008

(30) Foreign Application Priority Data

Jul. 20, 2006   (JP)   ............................ P2006-198713

(51) Int. Cl.
*H03K 3/00* (2006.01)
*H03K 5/13* (2006.01)
*H03H 11/16* (2006.01)

(52) U.S. Cl. ........................ 327/231; 327/233; 327/234

(58) Field of Classification Search .......... 327/231–260
See application file for complete search history.

(56) References Cited

U.S. PATENT DOCUMENTS 3,293,424 A * 12/1966 Fisher ........................ 708/835

5,668,749 A * 9/1997 Corleto et al. ............... 708/490
5,877,713 A    3/1999 Marie
2004/0164779 A1 * 8/2004 Cucchi et al. ............... 327/231

FOREIGN PATENT DOCUMENTS

JP           10-150363       6/1998

* cited by examiner

*Primary Examiner*—Lincoln Donovan
*Assistant Examiner*—Daniel Rojas
(74) *Attorney, Agent, or Firm*—Finnegan, Henderson, Farabow, Garrett & Dunner, L.L.P.

(57) ABSTRACT

The present invention provides a phase shifter comprising a first multiplier unit that outputs a first output signal obtained by multiplying an input signal input thereto by a multiplication value calculated based upon a first digital control signal also input thereto and specifying a phase shift quantity for the input signal, a second multiplier unit that outputs a second output signal obtained by multiplying an orthogonal input signal input thereto and having a phase perpendicular to the phase of the input signal by a multiplication value calculated based upon a second digital control signal also input thereto and specifying the phase shift quantity, and an adder/subtractor unit that executes addition or subtraction by using the first output signal and the second output signal based upon a third digital control signal corresponding to the phase shift quantity.

9 Claims, 6 Drawing Sheets

FIG.2

| PHASE SHIFT QUANTITY X | COS(X) | SIN(X) | DIGITAL CONTROL SIGNAL C[0:3] | | | | FIRST DIGITAL CONTROL SIGNAL C1[0:3] | | | | SECOND DIGITAL CONTROL SIGNAL C2[0:3] | | | | THIRD DIGITAL CONTROL SIGNAL C3[0:1] | |
|---|---|---|---|---|---|---|---|---|---|---|---|---|---|---|---|---|
| 0° | 1.0000 | 0 | 0 | 0 | 0 | 0 | 1 | 0 | 0 | 0 | 0 | 0 | 0 | 0 | 1 | 1 |
| 30° | 0.8660 | 0.5000 | 0 | 0 | 0 | 1 | 0 | 1 | 0 | 0 | 0 | 1 | 0 | 0 | 1 | 1 |
| 60° | 0.5000 | 0.8660 | 0 | 0 | 0 | 0 | 0 | 0 | 1 | 0 | 0 | 0 | 1 | 0 | 1 | 1 |
| 90° | 0 | 1.0000 | 0 | 0 | 1 | 1 | 0 | 0 | 0 | 1 | 0 | 0 | 0 | 1 | 1 | 1 |
| 120° | -0.5000 | 0.8660 | 0 | 1 | 0 | 0 | 0 | 1 | 0 | 0 | 1 | 0 | 0 | 0 | 1 | 0 |
| 150° | -0.8660 | 0.5000 | 0 | 1 | 0 | 1 | 1 | 0 | 0 | 0 | 0 | 1 | 0 | 0 | 1 | 0 |
| 180° | -1.0000 | 0 | 0 | 1 | 1 | 0 | 0 | 1 | 0 | 0 | 0 | 0 | 1 | 1 | 1 | 0 |
| 210° | -0.8660 | -0.5000 | 0 | 1 | 1 | 1 | 0 | 0 | 1 | 0 | 0 | 1 | 0 | 0 | 0 | 0 |
| 240° | -0.5000 | -0.8660 | 1 | 0 | 0 | 0 | 0 | 0 | 0 | 1 | 1 | 0 | 0 | 0 | 0 | 0 |
| 270° | 0 | -1.0000 | 1 | 0 | 0 | 1 | 0 | 0 | 1 | 0 | 0 | 0 | 0 | 1 | 0 | 0 |
| 300° | 0.5000 | -0.8660 | 1 | 0 | 1 | 0 | 0 | 1 | 0 | 0 | 0 | 0 | 1 | 0 | 1 | 0 |
| 330° | 0.8660 | -0.5000 | 1 | 0 | 1 | 1 | 1 | 0 | 0 | 0 | 0 | 0 | 0 | 0 | 1 | 0 |

PHASE SHIFTER AND PHASE SHIFT METHOD

CROSS REFERENCE TO RELATED APPLICATION

The present invention contains subject matter related to Japanese Patent Application JP 2006-198713 filed in the Japan Patent Office on Jul. 20, 2006, the entire contents of which are incorporated herein by reference.

BACKGROUND OF THE INVENTION

1. Field of the Invention

The present invention relates to a phase shifter and a phase shift method.

2. Description of the Related Art

A phase shifter alters the phase of an AC voltage or an AC current. Phase shifters are utilized in a wide range of applications. For instance, a phase shifter in a portable telephone converts the phase of a electromagnetic wave transmitted from a base station so as to improve the reception sensitivity with which the electromagnetic wave transmitted from the base station is received.

To respond to the broad demand, various types of phase shifters, some using analog signals and others using digital signals, are being developed.

Technologies related to phase shifters that use analog signals include that disclosed in patent reference literature 1. Technologies related to phase shifters that use digital signals include that disclosed in patent reference literature 2.

(Patent Reference Literature 1) UK Patent Specification No. 1527603

(Patent Reference Literature 2) Japanese Laid Open Patent Publication No. H10-150363

SUMMARY OF THE INVENTION

In a phase shifter in the related art that uses analog signals, adopting a structure in which an analog signal for specifying the phase shift quantity is directly generated via a potentiometer or the like, the amplitude and the phase of the analog signal generated via the potentiometer or the like may not always achieve desired values due to the analog characteristics of the potentiometer or the like. For this reason, a significant error relative to the desired phase shift quantity (i.e., the ideal value) may occur with regard to the phase shift quantity representing the extent by which the phase of an input signal is shifted by using the analog signal.

In addition, while a phase shifter in the related art that uses digital signals shifts the phase of an input, signal by digitally multiplying the input signal by a digital signal equivalent to the analog signal described above, the digital signal, which assumes a discrete value, does not perfectly match the analog signal. For this reason, the phase shift quantity by which the phase shifter in the related art that uses a digital signal shifts the phase of the input signal typically manifests an analogous error relative to the desired phase shift quantity.

Thus, neither phase shifter in the related art, using analog signals or digital signals, with inherent factors that, may induce an error, is capable of executing a highly accurate phase shift.

Accordingly, the present invention, having been completed by addressing the issues discussed above, provides a new and improved phase shifter and a new and improved phase shift method, with which a highly accurate phase shift can be achieved.

(Means for Solving the Problems)

According to an embodiment of the present invention, there is provided a phase shifter comprising a first multiplier unit that outputs a first output signal obtained by multiplying an input signal input thereto by a multiplication value, calculated based upon a first digital control signal also input thereto and defining a phase shift quantity for the input signal, a second multiplier unit that outputs a second output signal obtained by multiplying an orthogonal input signal, input thereto and having a phase perpendicular to the phase of the input, signal by a multiplication value, calculated based upon a second digital control signal also input thereto and specifying the phase shift, quantity, and an adder/subtractor unit, that executes in addition or subtraction by using the first output signal and the second output signal in correspondence to a third digital control signal specifying the phase shift quantity.

The phase shifter includes at least the first multiplier unit, the second multiplier unit and the adder/subtractor unit. The first multiplier unit, to which the input signal to undergo the phase shift and the first digital control signal specifying the phase shift quantity for the input signal are input, multiplies the input signal by the multiplication value calculated based upon the first digital control signal. Since the first digital control signal is not directly used as the multiplication value by which the input signal is multiplied, the multiplication results do not manifest an analogous error relative to the ideal value, unlike in the phase shifter in the related art that uses a digital signal.

The second multiplier unit, to which the orthogonal input signal having a phase perpendicular to the phase of the input signal and the second digital control signal specifying the phase shift quantity for the input signal are input, multiplies the orthogonal input signal by the multiplication value calculated based upon the second digital control signal. Just as the first digital control signal is not directly used as the multiplication value in the first multiplier unit, the second digital control signal is not directly utilized as the multiplication value by which the orthogonal input signal is multiplied, and thus, the multiplication results obtained in the second multiplier unit do not manifest an analogous error relative to the ideal value, either.

The adder/subtractor unit, to which the third digital control signal corresponding to the phase shift quantity for the input signal, the first output signal output from the first multiplier unit and indicating the multiplication results and the second output signal output from the second multiplier unit and indicating the multiplication results are input, executes addition or subtraction by using the first output signal and the second output signal based upon the third digital control signal. Neither the first output signal nor the second output signal manifests an analogous error relative to the corresponding ideal value. Thus, an output signal resulting from the addition or subtraction executed by using the first output signal and the second output signal, i.e., a signal obtained by shifting the phase of the input signal, achieves a very high level of phase shift accuracy with which the phase of the input signal is shifted by the desired phase shift quantity.

In addition, the first multiplier unit may include an operational amplifier, an input resistor having a predetermined input resistance value and a feedback resistor at which a specific feedback resistance value is selected based upon the first digital control signal. The multiplication value calculated based upon the first digital control signal in such a first multiplier unit may be the ratio of the feedback resistance value at the feedback resistor relative to the input resistance value at the input resistor.

The first multiplier unit described above is a differential input circuit that in eludes an operational amplifier, an input resistor with a predetermined resistance value and a feedback resistor. At the first multiplier unit, the value of the ratio of the feedback resistance relative to the input resistance can be varied based upon the first digital control signal by selecting a specific resistance value at the feedback resistor based upon the first digital control signal.

The first output signal output from the first multiplier unit indicates the value obtained by multiplying the input signal by the value representing the ratio of the feedback resistance relative to the input resistance. The ratio of the feedback resistance relative to the input resistance assumes a relative value. Accordingly, as long as the input resistor and the feedback resistor are manufactured through a single manufacturing process, the extent of relative nonuniformity in the input resistor and the feedback resistor can be minimized even when there are absolute inconsistencies, since the characteristics of such absolute inconsistencies will be identical. As a result, the first output signal does not induce an analogous error relative to the ideal value.

In addition, the second multiplier unit may include an operational amplifier, an input resistor having a predetermined resistance value and a feedback resistor at which a specific resistance value is selected based upon the second digital control signal. The multiplication value calculated based upon the second digital control signal in such a second multiplier unit may be the ratio of the feedback resistance value at the feedback resistor relative to the input resistance value at the input resistor.

The second multiplier unit described above is a differential input circuit that includes an operational amplifier, an input resistor with a predetermined resistance value and a feedback resistor. At the second multiplier unit, the value of the ratio of the feedback resistance relative to the input resistance can be varied based upon the second digital control signal by selecting a specific resistance value at the feedback resistor based upon the second digital control signal.

The second output signal output from the second multiplier unit indicates the value obtained by multiplying the orthogonal input signal by the value representing the ratio of the feedback resistance relative to the input resistance. The ratio of the feedback resistance relative to the input resistance assumes a relative value. Accordingly, as long as the input resistor and the feedback resistor are manufactured through a single manufacturing process, the extent of relative nonuniformity between the input resistor and the feedback resistor can be minimized even when there are absolute inconsistencies, since the characteristics of such absolute inconsistencies will be identical. As a result, the second output signal does not induce an analogous error relative to the ideal value.

The first output signal may include a first normal-phase output signal and a first, opposite-phase output signal used as a differential signal and the second output signal may include a second normal-phase output, signal and a second opposite-phase output signal used as a differential signal. In such a case, the adder/subtracter unit may execute the addition or the subtraction of the first, output signal and the second output signal based upon the third digital control signal by selecting either the first normal-phase output signal or the first opposite-phase output signal as a differential signal reference so as to assume a normal phase or an inverse phase for the first output signal, and selecting either the second normal-phase output signal or the second opposite-phase output signal so as to assume a normal phase or an inverse phase for the second output signal.

The first output signal output, from the first multiplier unit is a differential signal made up of the first normal-phase output signal and the first opposite-phase output signal, the phase of which is shifted by 180° relative to the phase of the first normal-phase output signal. In addition, the second output signal output from the second multiplier unit is a differential signal made up of the second normal-phase output signal and the second opposite-phase output signal, the phase of which is shifted by 180° relative to the phase of the second normal-phase output signal.

The first multiplier unit and the second multiplier unit each multiply the input signal or the orthogonal input signal by the value representing the ratio of the feedback resistance relative to the input resistance. Since the resistance invariably assumes a positive value, the value representing the ratio of the feedback resistance relative to the input resistance, too, is always positive. The adder/subtractor unit shifts the phase of the first output signal ahead or back by selecting either the first normal-phase output signal or the first opposite-phase output signal as the differential signal reference based upon the third digital control signal. In addition, the adder/subtractor unit shifts the phase of the second output signal ahead or back by selecting either the second normal-phase output signal or the second opposite-phase, output signal as the differential signal reference based upon the third digital control signal. The adder/subtractor unit executes the addition or the subtraction of the first output signal and the second output signal as described above. Since the adder/subtractor unit executes the addition/subtraction by using differential signals, noise manifesting at levels equal to each other in the normal-phase output signal and the opposite-phase output signal is canceled out even when noise occurs in the first output signal or the second output signal. Consequently, with the adverse effect of noise minimized as described above, the phase shifter is able to achieve a phase shift with an even higher level of accuracy.

The phase shifter may further comprise a control signal generation unit that outputs the first digital control signal, the second digital control signal and the third digital control signal based upon a digital control signal indicating the phase shift quantity.

The control signal generation unit, outputs the first digital control signal, the second digital control signal and the third digital control signal described above based upon a digital control signal indicating the shift quantity. The phase shifter equipped with such a control signal generation unit is able to achieve a highly accurate phase shift in response to a single control signal input thereto without having to, for instance, input the three control signals, i.e., the first digital control signal, the second digital control signal and the third digital control signal, from outside of the phase shifter.

According to the embodiments of the present invention described above, a phase shift, method comprising steps of multiplying an input signal by a first multiplication value calculated based upon a digital control signal defining a phase shift quantity for the input signal, multiplying an orthogonal input signal having a phase perpendicular to the phase of the input signal by a second multiplication value calculated based upon the digital control signal and executing addition or subtraction based upon the digital control signal by using a first output signal, resulting from multiplication of the input signal and the first multiplication value, and a second output signal, resulting from multiplication of the orthogonal input signal and the second multiplication value.

Since a highly accurate phase shift with an extremely small error relative to the ideal value is achieved by adopting the method described above, the reception sensitivity in a portable telephone, for instance, with which electromagnetic waves transmitted from a base station are received, can be raised to the maximum level.

According to the embodiments of the present invention described above, a highly accurate phase shift can be executed.

BRIEF DESCRIPTION OF THE DRAWINGS

FIG. 2 is a diagram, presenting an example of a relationship that may exist with regard to the phase shift quantify, the digital control signal, the first digital control signal, the second digital control signal and the third digital control signal in the embodiment of the present invention;

DETAILED DESCRIPTION OF THE PREFERRED EMBODIMENTS

Figure 1:
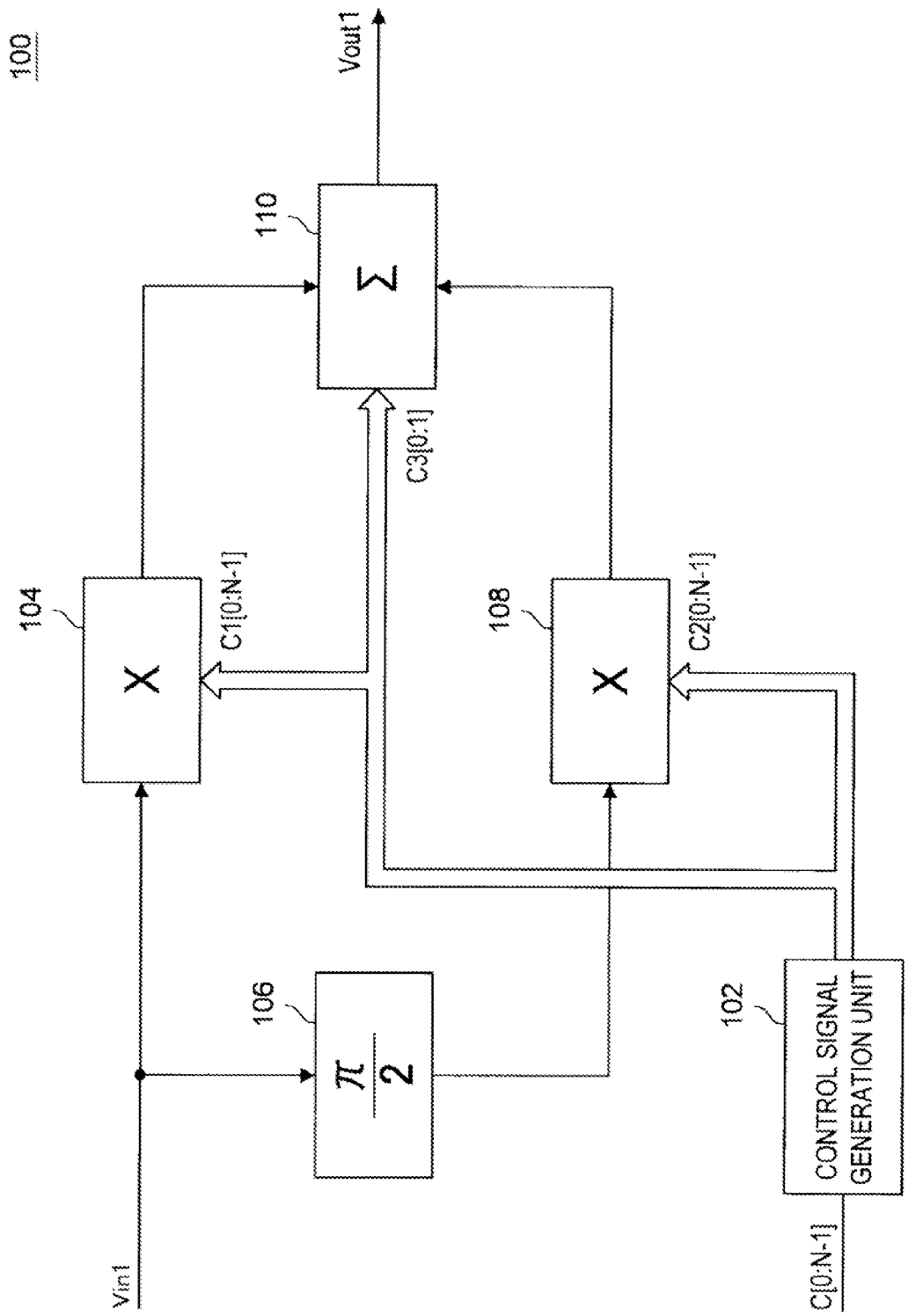
FIG. 1 is a block diagram of the phase shifter achieved in an embodiment of the present invention.

Hereafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

Principle of Phase Shift Adopted in the Embodiments of the Present Invention First, the principle of the phase shift adopted in the embodiments of the present invention is explained. With an input signal Vin1 expressed as Vin1=A·cos(ωt) (A represents the amplitude and ωt represents the phase), an output signal Vout1 obtained by shifting the phase of the input signal Vin1 by X (X represents the phase shift quantity indicating the extent of phase shift) is expressed as in (1) below.

$$Vout1 = B\cos(\omega t - X) \quad \text{(expression 1)}$$
$$= B\{\cos(\omega t)\cos(X) + \sin(\omega t)\sin(X)\}$$
$$= A\cos(\omega t)V\cos(X) + A\sin(\omega t)V\sin(X)$$
$$= Vin1\, V\cos(X) + A\sin(\omega t)V\sin(X)$$

In addition, the cosine and the sine have a relationship whereby their phases are offset by 90° from each other as expressed in (2) below.

(Expression 2)

$$\sin(X) = \cos(\pi/2 - X) \quad \text{(expression 2)}$$

Expressions 1 and 2 indicate that the output signal Vout1 is calculated as the sum of the value obtained by multiplying the input signal Vin1=A·cos(ωt) by a signal V·cos(X) (hereafter referred to as the "multiplication signal") and the value obtained by multiplying the orthogonal input signal A·sin(ωt) having a phase perpendicular to the phase of the input signal Vin1 by a signal V·sin(X) (hereafter referred to as an "orthogonal multiplication signal"). It is to be noted that B and V in expression 1 each represent an amplitude.

In addition, while the phase may be shifted within the range of; 0°≦X≦360°, the entire range of phase shift, can be actually expressed without quoting angles greater than 90°, i.e., within the range of 0°≦X≦90°, based upon the principle of reference angles, e.g., cos(165°)=−cos(15°), cos(195°)=−cos(15°) and cos(45°)=cos(15°). In other words, a phase shift over the range 90°<X≦360° can be achieved by executing addition or subtraction in expression 1.

Accordingly, the phase shift is realized as the input signal Vin1 and the signal (hereafter referred to as the "orthogonal input signal") having a phase perpendicular to the phase of the input signal Vin1 are multiplied respectively by the cosine signal (i.e., the multiplication signal V·cos(X)) or the sine signal (i.e., the orthogonal multiplication signal V·sin(X)) with amplitudes and phases equal to each other and then addition or subtraction is executed by using the values resulting from the multiplication.

It is to be noted that as (expression 2) indicates, once one of the cosine value or the sine value is determined, the other value can be calculated. This means that while the input signal Vin1 is defined as A·cos(ωt) in the explanation provided above, it is obvious that, a phase shift can be achieved by defining the input, signal Vin1 as A·sin(ωt) instead of A·cos(ωt).

Next, the concerns that need to be addressed with regard to the phase shifters in the related art are explained so as to highlight the differences between the embodiments of the present invention and the phase shifters in the related art.

(Concerns with Regard to Phase Shifters in the Related Art that use Analog Signals)

First, the issues to be addressed in the phase shifters in the related art that use analog signals are described. As explained earlier, the input signal Vin1 and the orthogonal input signal must be multiplied respectively by the multiplication signal V·cos(X) or the orthogonal multiplication signal V·sin(X) respectively in order to shift the phase by the shift quantity X. In a phase shifter in the related art that uses analog signals, the multiplication signal V·cos(X) and the orthogonal multiplication signal V·sin(X) are directly generated by using a potentiometer or the like and the phase of the input signal Vin1 is shifted by using the multiplication signal V·cos(X) and the orthogonal multiplication signal V·sin(X) thus generated.

The amplitudes and the phases of the multiplication signal V·cos(X) and the orthogonal multiplication signal V·sin(X) generated via a potentiometer or the like do not match the respective ideal values V and X due to the analog characteristics inherent to the element itself, which induces a significant error. In addition, the error becomes larger as the input signal Vin1 is multiplied by the multiplication signal V·cos(X) or the orthogonal input signal is multiplied by the orthogonal multiplication signal V·sin(X). This ultimately results in an error in the phase shift quantity too large be tolerated for effective phase shift.

In other words, the risk of the potential error described above is inherent to the phase shifter in the related art that, uses analog signals as long as if assumes a structure in which the multiplication signal V·cos(X) and the orthogonal multiplication signal V·sin(X) are directly generated.

(Concerns with Regard to Phase Shifters in the Related Art that use Digital Signals)

First, the issues to be addressed in the phase shifters in the related art that, use digital signals are described. Unlike the phase shifter in the related art that uses analog signals described above, the phase shifter in the related art that uses digital signals does not execute analog multiplication by directly generating the multiplication signal V·cos(X) and the orthogonal multiplication signal V·sin(X). Instead, it executes a phase shift by executing digital multiplication with a digital signal Ci (Ci is an i-bit signal, with I representing a positive integer) equivalent to the multiplication signal V·cos (X) and a digital signal Si (Si is an i-bit signal) equivalent to the orthogonal multiplication signal V·sin(X). When shifting the phase of an input, signal Vin2=A·cos(ωt) by, for instance, 22.5°, the output signal Vout2 is expressed as in (3) below.

$$\begin{aligned}
Vout2 &= Vin2Ci + A\sin(\omega t)Si \quad &\text{(expression 3)}\\
&= A\cos(\omega t)5 + A\sin(\omega t)2\\
&= \sqrt{5^2 + 2^2} A \left\{ \begin{array}{l} 5/\sqrt{5^2 + 2^2}\cos(\omega t) + \\ 2/\sqrt{5^2 + 2^2}\sin(\omega t) \end{array} \right\}\\
&\quad \sqrt{5^2 + 2^2} A \left\{ \begin{array}{l} \cos(\omega t)\cos(\tan^{-1}2/5) + \\ \sin(\omega t)\sin(\tan^{-1}2/5) \end{array} \right\}\\
&= B\cos(\omega t) - 21.801\dots)\\
&\approx B\cos(\omega t - 22.5)
\end{aligned}$$

As expression 3 indicates, an analogous error occurs between the desired phase shift quantity and the actual phase shift quantity achieved in the phase shifter in the related art that uses digital signals, since the digital signals Ci and Si used in the phase shifter, which are constituted with digital data, each assume a discrete value.

This analogous error can be reduced by increasing the number of bits in the digital signals Ci and Si to a sufficient degree so as to raise the resolution. However, in order to raise the resolution to a significant extent, the phase shifter in the related art must assume a larger scale circuit structure. Furthermore, the analogous error can never he completely eliminated even by raising the resolution to a sufficient extent. Accordingly, a certain analogous error is normally regarded as a known error in the phase shifter in the related art that uses digital signals and the error is corrected by engaging a separate device is engaged as necessary following the phase shift.

In short, since the analogous error can never be completely eliminated in the phase shifter in the related art that uses digital signals, the error must be corrected separately after the phase is shifted by the phase shifter.

As described above, factors that would potentially induce errors are inherent to the phase shifters in the related art that use analog signals and digital signals, and for this reason, they cannot be expected to assure high accuracy in the phase shift. Bearing this in mind, the preferred embodiments of the present invention are explained in detail next.

Embodiments of the Present Invention

FIG. 1 is a block diagram of a phase shifter 100 achieved in an embodiment of the present invention As shown in FIG. 1, the phase shifter 100 achieved in the embodiment of the present invention includes a control signal generation unit 102, a first multiplier unit 104, a perpendicular phase generation unit 106, a second multiplier unit 108 and an adder/subtractor unit 110.

The control signal generation unit 102 generates a first digital control signal C1 [0:N−1], a second digital control signal C2 [0:N−1] and a third digital control signal C3 [0:1] by using a digital control signal C [0:N−1] input thereto from the outside. N represents a positive integer, whereas [0:N−1] indicates that the signal is an N-bit digital signal.

The first digital control signal C1 [0:N−1] is a signal defining the multiplication value to be used in the first, multiplier unit 104, whereas the second digital control signal C2 [0:N−1] is a signal defining the multiplication value to be used in the second multiplier unit 108. In addition, the third digital control signal C3 [0:1] is a signal defining the type of operation to be executed at the adder/subtractor unit 110, i.e., a signal that determines whether addition or subtraction is to be executed at the adder/subtractor unit.

FIG. 2 is a diagram, presenting an example of a relationship that may exist among the phase shift quantity X, the digital control signal C [0:N−1], the first digital control signal C1 [0:N−1], the second digital control signal C2 [0:N−1] and the third digital control signal C3 [0:1] in the embodiment of the present invention.

As described above, the cosine value cos(X) and the sine value sin(X) are determined in a unique one-to-one correspondence relative to the desired phase shift quantity X. In the phase shifter 100 achieved in the embodiment of the present invention, the digital control signal C [0:N−1] inherent to the desired phase shift, quantity X is defined and the control signal generation unit 102 outputs the first digital control signal C1 [0:N−1] for the first multiplier unit 104, the second digital control signal C2 [0:N−1] for the second multiplier unit 108 and the third digital control signal C3 [0:1] for the adder/subtractor unit. 110.

Thus, once the digital control signal C [0:N−1] corresponding to the steps in which the phase can be shifted by the phase shifter 100 is input from the outside to the phase shifter 100 in the embodiment of the present invention, the phase can be shifted based upon the first digital control signal C1 [0:N−1], the second digital control signal C2 [0:N−1] and the third digital control signal C3 [0:1], as shown in FIG. 2.

For instance, the phase shift is executed in 30° steps in the example presented in FIG. 2. In this ease, the phase shift quantity X to be achieved in the phase shifter 100 can be adjusted to one of 12 different phase shift quantities and the digital control signal C [0:N−1] only needs to be a 4-bit signal, i.e., C [0:3].

It is obvious that the digital control signal C [0:N−1] used when shifting the phase in 30° steps, as shown in FIG. 2, may be a digital signal with five bits or more.

In addition, the phase shift quantity X, the digital control signal C [0:N−1], the first, digital control signal C1 [0:N−1], the second digital control signal C2 [0:N−1] and the third digital control signal C3 [0:1] may have a relationship other than that indicated by the values presented in FIG. 2, and their relationship can be set freely.

Furthermore, while the digital control signal C [0:N−1] is input, to the control signal generation unit 102 from the outside of the phase shifter 100 and the first digital control signal C1 [0:N−1], the second digital control signal C2 [0:N−1] and the third digital control signal C3 [0:1] are generated based upon the digital control signal C [0:N−1] in the structure shown, in FIG. 1, the present invention is not limited to this example. For instance, the phase shifter 100 may assume a structure that dowsnot include the control signal generation unit 102 and, in such a case, the first digital control signal C [0:N−1], the second digital control signal C2 [0:N−1] and the third digital control signal C3 [0:1] may be input from the outside to the phase shifter 100.

The first multiplier unit 104 multiplies the input signal Vin1, input to the phase shifter 100 to undergo a phase shift, by the multiplication value, which is calculated based upon the first digital control signal C1 [0:N−1] and is equivalent to the multiplication signal mentioned earlier, and outputs the first output signal. The multiplication value by which the input signal Vin1 input to the phase shifter 100 is multiplied, is not the multiplication signal itself and the amplitude V in expression 1 assumes a value equivalent to V=1.0000. The structure adopted in the first multiplier unit 104 is to be detailed later.

The input signal Vin1 is input to the perpendicular phase generation unit 106 which then outputs an orthogonal input signal having a phase perpendicular to the phase of the input signal Vin1.

The second multiplier unit 108 multiplies the orthogonal input signal Vin1 by the multiplication value, which is calculated based upon the second digital control signal C2 [0:N−1] and is equivalent to the orthogonal multiplication signal mentioned earlier, and outputs the second output signal. The multiplication value by which the orthogonal input signal Vin1 is multiplied is not the orthogonal multiplication signal itself and the amplitude V in expression 1 assumes a value equivalent to V=1.0000. The structure adopted in the second multiplier unit 108 is to be detailed later.

It is to be noted that while the phase shifter 100 shown in FIG. 1 includes the perpendicular phase generation unit 106 that outputs the orthogonal input signal to be input to the second multiplier unit 108, the present, invention is not limited to this structural example and the orthogonal input signal generated outside of the phase shifter 100 may be input to the second multiplier unit 108 in the phase shifter 100 not equipped with the perpendicular phase generation unit 106.

The adder/subtractor unit 110 executes addition, or subtraction based upon the third digital control signal C3 [0:1] by using the first output signal output from the first, multiplier unit 104 and indicating the results of the multiplication having been executed therein and the second output signal output from the second multiplier unit 108 and indicating the results of the multiplication having been executed therein, and outputs an output signal Vout1 with a phase shifted relative to the phase of the input signal Vin1 by the desired phase shift quantity X. The specific structure adopted in the adder/subtractor unit 110 is to be described in detail later.

The structure described above, adopted in the phase shifter 100 in the embodiment of the present invention, enables the phase shifter 100 to execute a phase shift for the input signal Vin1. Next, the structures and functions of the first multiplier unit 104, the second multiplier unit 108 and the adder/subtractor unit 110 are explained.

Figure 3:
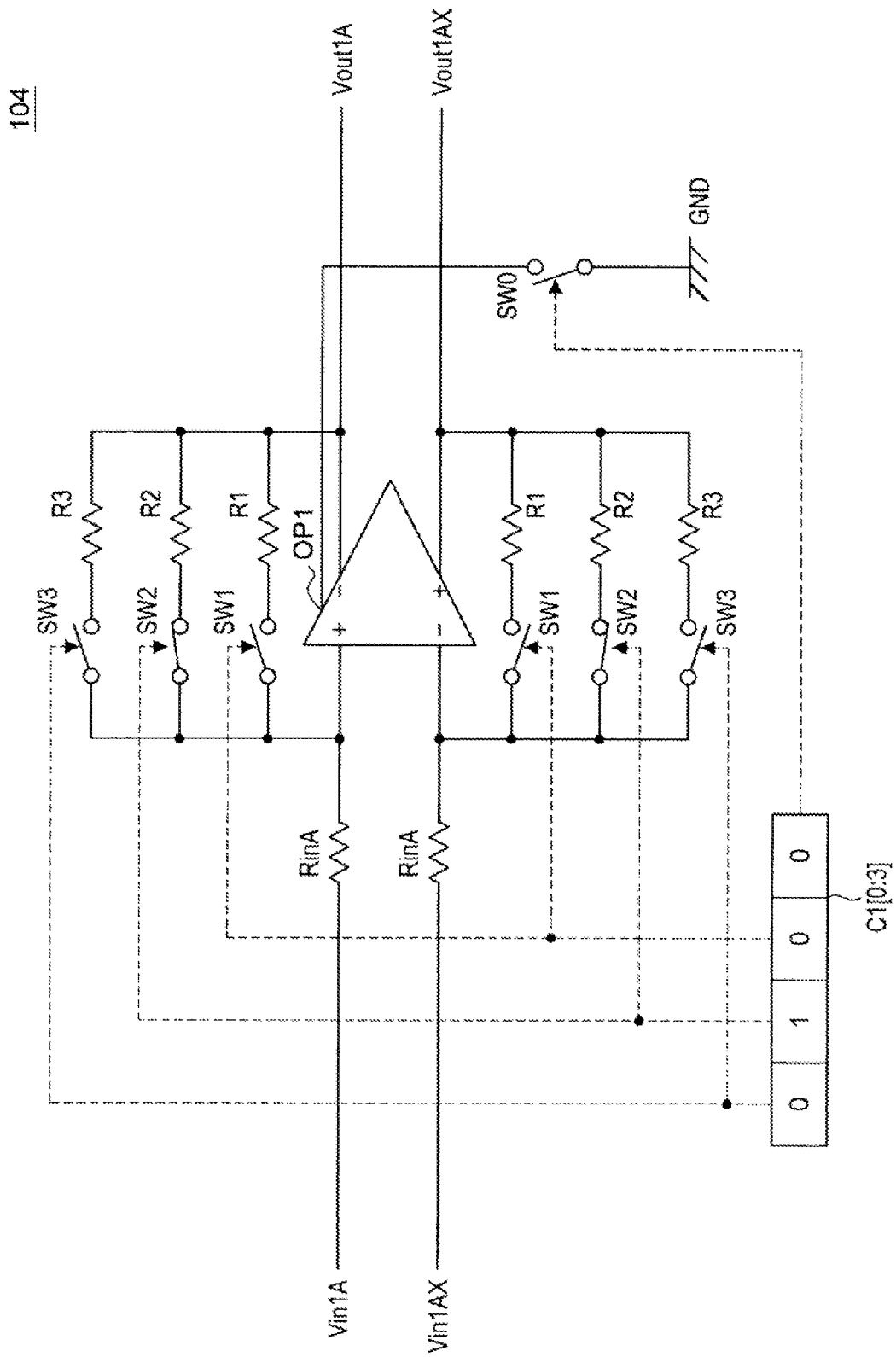
FIG. 3 is a circuit diagram presenting an example of a structure that may be adopted when shifting the phase in steps of 30° at the first multiplier unit in an embodiment of the present invention.

Structure and Function of the First Multiplier unit Achieved in an Embodiment of the Present Invention FIG. 3 is a circuit diagram showing a structure that may be adopted in the first multiplier unit 104 in an embodiment of the present invention to execute a phase shift in 30° steps, As shown in FIG. 3, the first multiplier unit 104 in the embodiment of the present invention is a differential input circuit that includes an operational amplifier OP1, input resistors RinA disposed symmetrically with respect to each other and having a predetermined input resistance value, and two sets of feedback resistors disposed symmetrically with respect to each other and each made up of feedback resistors R1, R2 and R3 each of which assumes a predetermined feedback resistance value. The first multiplier unit 104, to which a normal phase signal (hereafter referred to as a "first normal-phase input signal") Vin1A assuming a phase matching that of the input signal Vin1 and an opposite-phase signal (hereafter referred to as a "first opposite-phase input signal") Vin1AX having a phase shifted by 180° relative to the phase of the first normal-phase input signal Vin1A are input, outputs an output signal (hereafter referred to as a "first, normal-phase output signal") Vout1A corresponding to the first normal-phase input signal Vin1A and an output signal (hereafter referred, to as a "first opposite-phase output signal") Vout1AX corresponding to the first opposite-phase input signal Vin1AX.

The input/output relationship at the first multiplier unit 104, e.g., the relationship between the first normal-phase input, signal Vin1A and the first normal-phase output, signal Vout1A, may be expressed as in (4) below. It is to be noted that while expression 4 below indicates the relationship between the first normal-phase input signal Vin1A and the first normal-phase output signal Vout1A, the relationship between the first opposite-phase input signal Vin1AX and the first opposite-phase output signal Vout1AX is similar to that, expressed in expression (4).

(Expression 4)

Vout1A=feedback resistance value at feedback resistor/input resistance value at input resistor·Vin1A (expression 4)

As expressed above, the first multiplier unit 104 multiplies the first normal-phase input signal Vin1A by the ratio of the feedback resistance value relative to the input resistance value and also multiplies the first opposite-phase input, signal Vin1AX by the ratio of the feedback resistance relative to the input, resistance.

In addition, the first multiplier unit 104 includes a switch SW 0 that validates/invalidates the operational amplifier OP1, switches SW 1 each connected to one of the feedback resistors R1 disposed symmetrically with respect, to each other, switches SW 2 each connected to one of the feedback resistors R2 disposed symmetrically with respect to each other and switches SW 3 each connected to one of the feedback resistors R3 disposed symmetrically with respect to each other. The switches SW 0, SW 1, SW 2 and SW 3 are turned ON/OFF based upon the first, digital control signal C1 [0:3] so as to set specific switches in an ON state.

For instance, a digital signal [0100]$_2$ ("[ ]$_2$" indicates binary notation) corresponding to a phase shift quantity 150° is input as the first digital control signal C1 [0:3] in the example presented in FIG. 3. The switch SW 0 is turned ON/OFF based upon the value in the first bit in the first digital control signal C1 [0:3] and the switches SW 1 are turned ON/OFF based upon the value in the second bit of the first digital control signal C1 [0:3]. Likewise, the switches SW 2 and the switches SW 3 are respectively turned ON/OFF based upon the values in the third bit and the fourth bit in the first digital control signal C1 [0:3].

It is to be noted that, while a given switch (a given pair of switches) is turned off when the value at the corresponding bit is set to 0 and the switch (switches) is turned on when the value at the corresponding bit is set to 1 in the example presented in FIG. 3, the present invention is not limited to this example. In other words, the switches may be turned on when the corresponding bits are set to 0 and turned off when the corresponding bits are set to 1.

Thus, the value of the ratio of the feedback resistance relative to the input resistance can be varied in the first multiplier unit 104 by selectively switching to a specific feedback resistance value based upon the first digital control signal C1 [0:3]. Consequently, the multiplication value equivalent to the multiplication signal, too, can be varied by altering the value of the ratio of the feedback resistance relative to the input, resistance in the first multiplier unit 104.

As indicated in FIG. 2, the cosine value cos(X) and the sine value sin(X) corresponding to the desired phase shift quantity X are determined uniquely in a one-to-one correspondence. Accordingly, by selecting a value corresponding to the phase shift quantity X for the ratio of the feedback resistance relative to the input resistance based upon the first digital control signal C1 [0:3], the first multiplier unit 104 is able to output the desired multiplication value, i.e., the ideal multiplication value. For instance, by setting relationships expressed as; R1=0.5000×RinA, R2=0.8660×RinA and R3=1.0000×RinA for the input, resistors RinA and the feedback resistors R1, R2 and R3 and also allowing the operational amplifier OP1 to be validated/invalidated, a phase shift can be executed in 30° steps as the switches SW 0~SW 3 are turned ON/OFF based upon the first, digital control signal C1 [0:3]. It is to be noted that if the operational amplifier OP1 is invalidated by turning on the switch SW 0, no signal is output from the first multiplier unit 104, so as to indicate that the cosine value cos(X) or the sine value sin(X) is 0.

For instance, a digital signal $[0100]_2$ is input to the first multiplier unit 104 as the first digital control signal C1 [0:3] in FIG. 3. Accordingly, the first multiplier unit 104 outputs the first normal-phase output signal Vout1A=0.8660×Vin1A and the first opposite-phase output, signal Vout1AX=0.8660×Vin1AX based upon the first, digital control signal.

It is to be noted that, the relationships of the feedback resistors R1, R2 and R3 to the input resistors RinA are not limited to those described above and relationships expressed as, for instance, R1=1.0000×RinA, R2=0.8660×RinA and R3=0.5000×RinA may be selected instead. In such a case, too, a phase shift can be executed in 30° steps by adjusting the first digital control signal C1 [0:3] in correspondence to the selected relationships of the feedback resistors R1, R2 and R3 to the input resistors RinA.

In addition, it is obvious that a phase shift may be executed in any phase shift steps by increasing the number of feedback resistors and switches in correspondence to the desired phase shift steps, setting a specific resistance value for each pair of feedback resistors so that the ratio of the feedback resistance relative to the resistance value at the input resistors RinA determines the values of cos(X) and sin(X) corresponding to a given phase shift quantity X and controlling the individual switches based upon the first digital control signal C [0:N−1].

The individual resistance values assumed for the input resistors RinA and each of the feedback resistors R1, R2 and R3 may manifest absolute inconsistency. However, as long as the input resistors RinA and the feedback resistors R1, R2 and R3 are manufactured through, for instance, a single manufacturing process, the characteristics of absolute inconsistencies that may manifest with regard to the input resistors RinA and the feedback resistors R1, R2 and R3 will be identical to one another. Thus, the inconsistency in the ratios of the feedback resistances at the feedback resistors R1, R2 and R3 to the input resistance at the input resistors RinA, i.e., the extent of relative inconsistencies, can be reduced to a very low level.

The first multiplier unit 104 multiplies the first normal-phase input signal Vin1A and the first opposite-phase input signal Vin1AX by the ratio of the feedback resistance value relative to the input resistance value. For this reason, even when the extent of the absolute inconsistency among the resistance values is too great to be tolerated, the relative inconsistency in the ratios of the feedback resistance values to the input resistance value, i.e., the relative error of the ratio of a specific feedback resistance value relative to the input resistance value, can be reduced to a very low level. As a result, based upon the ratio of the feedback resistance value relative to the input resistance value, the cosine value cos(X) and the sine value sin(X) are determined uniquely on a one-to-one basis in correspondence to the desired phase shift quantity X with a very small error.

Consequently, the first multiplier unit 104 in the embodiment of the present invention, which multiplies the first normal-phase input signal Vin1A and the first opposite-phase input signal Vin1AX by the ratio of the feedback resistance value relative to the input resistance value, is capable of providing the ideal multiplication results as indicated in expression 1.

Figure 4:
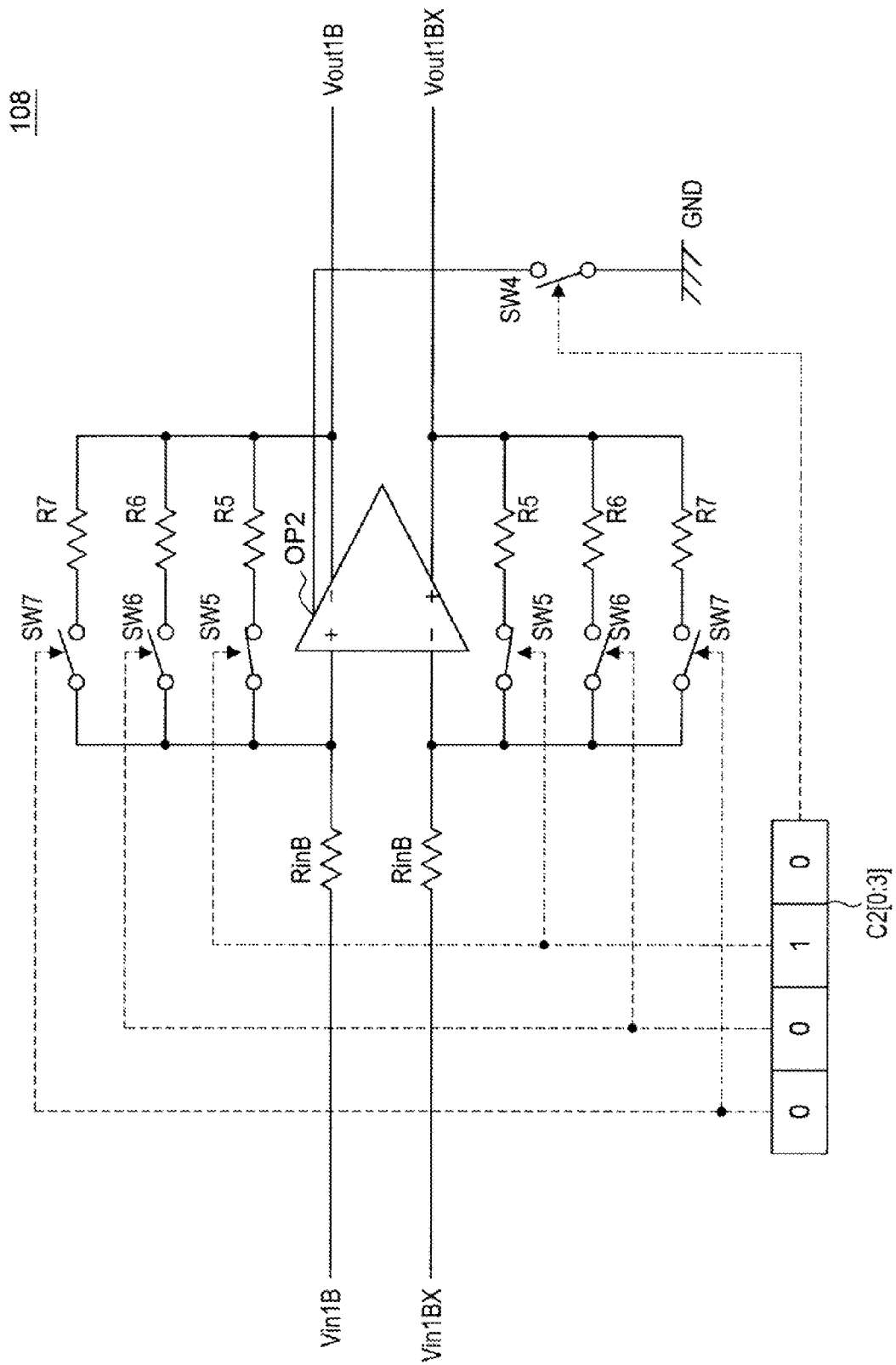
FIG. 4 is a circuit diagram presenting an example of a structure that may be adopted when shifting the phase in steps of 30° at the second multiplier unit in an embodiment of the present invention.

Structure and Function of the Second Multiplier Unit Achieved in an Embodiment of the Present Invention FIG. 4 is a circuit diagram showing a structure that may be adopted in the second multiplier unit 108 in an embodiment of the present invention to execute a phase shift in 30° steps.

As shown in FIG. 4, the second multiplier unit 108 in the embodiment of the present invention is a differential input circuit that includes an operational amplifier OP2, input resistors RinB disposed symmetrically with respect to each other and having a predetermined input resistance value, and two sets of feedback resistors disposed symmetrically with respect to each other and each made up of feedback resistors R5, R6 and R7 each of which assumes a predetermined feedback resistance value. The second multiplier unit 108, to which a normal phase signal (hereafter referred to as a "second normal-phase input signal") Vin1B assuming a phase matching that of the orthogonal input signal and an opposite-phase signal (hereafter referred to as a "second opposite-phase input signal") Vin1BX having a phase shifted by 180° relative to the phase of the second normal-phase input signal Vin1B are input, outputs an output signal (hereafter referred to as a "second normal-phase output signal") Vout1B corresponding to the second normal-phase input signal Vin1B and an output signal (hereafter referred to as a "second opposite-phase output signal") Vout1BX corresponding to the second opposite-phase input signal Vin1BX.

In addition, the second multiplier unit 108, adopting a structure similar to that of the first multiplier unit 104 described above, includes a switch SW 4 that validates/invalidates the operational amplifier OP2, switches SW 5 each connected to one of the feedback resistors R5 disposed symmetrically with respect to each other, switches SW 6 each connected to one of the feedback resistors R6 disposed symmetrically with respect to each other and switches SW 7 each connected to one of the feedback resistors R7 disposed symmetrically with respect to each other. The switches SW 4, SW 5, SW 6 and SW 7 are turned ON/OFF based upon the second digital control signal C2 [0:3] so as to set specific switches in an ON state.

The input/output relationship at the second multiplier unit 108, e.g., the relationship between the second normal-phase input signal Vin1B and the second normal-phase output signal Vout1B, may be expressed as in (5) below. It is to be noted that while expression 5 below indicates the relationship between the second normal-phase input, signal Vin1B and the second normal-phase output signal Vout1B, the relationship between the second opposite-phase input signal Vin1BX and the second opposite-phase output signal Vout1BX is similar to that expressed in expression (5).

(Expression 5)

$$\text{Vout1B} = \text{feedback resistance value/input resistance value} \cdot \text{Vin1B} \quad \text{(expression 5)}$$

As expressed above, the second multiplier unit 108 multiplies the second normal-phase input signal Vin1B by the ratio of the feedback resistance value relative to the input resistance value and also multiplies the second opposite-phase input signal Vin1BX by the ratio of the feedback resistance relative to the input resistance.

The multiplication function achieved in the second multiplier unit 108 as expressed in expression 5 is similar to the multiplication function of the first multiplier unit 104 explained earlier in reference to expression 4. Thus, the value of the ratio of the feedback resistance relative to the input resistance can be varied in the second multiplier unit 108 by selectively switching to a specific feedback resistance value based upon the second digital control signal C2 [0:3]. Consequently, the multiplication value equivalent to the orthogonal multiplication signal, too, can be varied by altering the value of the ratio of the feedback resistance relative to the input resistance in the second multiplier unit 108.

Accordingly, by selecting a value corresponding to the phase shift quantity X for the ratio of the feedback resistance relative to the input resistance based upon the second digital control signal C2 [0:3], the second multiplier unit 108 is able to output the desired multiplication value, i.e., the ideal multiplication value. For instance, by setting the relationships expressed as; R5=0.5000×RinB, R6=0.8660×RinB and R7=1.0000×RinB for the input resistors RinB and the feedback resistors R5, R6 and R7 and also allowing the operational amplifier OP2 to be validated/invalidated, a phase shift can be executed in 30° steps as the switches SW 4~SW 7 are turned ON/OFF based upon the second digital control signal C2 [0:3]. It is to be noted that if the operational amplifier OP2 is invalidated by turning on the switch SW 4, no signal is output from the second multiplier unit 108, so as to indicate that the cosine value cos(X) or the sine value sin(X) is 0.

For instance, a digital signal $[0010]_2$ corresponding to a phase shift quantity 150° is input to the second multiplier unit 108 as the second digital control signal C2 [0:3] in FIG. 4. Accordingly, the second multiplier unit 108 outputs the second normal-phase output signal Vout1B=0.5000×Vin1B and the second opposite-phase output signal Vout1BX=0.5000×Vin1BX based upon the second digital control signal.

It is to be noted that the relationships of the feedback resistors R5, R6 and R7 to the input resistors RinB are not limited to those described above and relationships expressed as, for instance, R5=0.8660×RinB, R6=1.0000×RinB and R7=0.5000×RinB may be selected instead. In such a case, too, a phase shift can be executed in 30° steps by adjusting the second digital control signal C2 [0:3] in correspondence to the selected relationships of the feedback resistors R5, R6 and R7 to the input resistors RinB.

In addition, it is obvious that a phase shift may be executed in any phase shift steps by increasing the quantities of feedback resistors and switches in correspondence to the desired phase shift steps, setting a specific resistance value for each pair of feedback resistors so that the ratio of the feedback resistance relative to the resistance value at the input resistors RinB determines the values of cos(X) and sin(X) corresponding to a given phase shift quantity X and controlling the individual switches based upon, the second digital control signal C2 [0:N−1].

The individual resistance values assumed for the input resistors RinB and the feedback resistors R5, R6 and R7 may each manifest absolute inconsistency. However, as long as the input resistors RinB and the feedback resistors R5, R6 and R7 are manufactured through, for instance, a single manufacturing process, the characteristics of absolute inconsistencies that may manifest with regard to the input resistors RinB and the feedback resistors R5, R6 and R7 will be identical to one another. Thus, the inconsistency in the ratios of the feedback resistances at the feedback resistors R5, R6 and R7 to the input resistance at the input resistors RinB, i.e., the extent of relative inconsistencies, can be reduced to a very low level.

The second multiplier unit 108, adopting a structure similar to that of the first multiplier unit 104 explained earlier, multiplies the second normal-phase input signal Vin1B and the second opposite-phase input signal Vin1BX by the ratio of the feedback resistance value relative to the input resistance value. For this reason, even when the extent of the absolute inconsistency among the resistance values is too great to be tolerated, the relative inconsistency among the ratios of the feedback resistance values relative to the input resistance value, i.e., the relative error of the ratio of the feedback resistance value relative to the input, resistance value, can be reduced to a very low level. As a result, based upon the ratio of a specific feedback resistance value relative to the input resistance value, a cosine value cos(X) and a sine value sin(X) are determined uniquely on a one-to-one basis in correspondence to the desired phase shift quantity X with a very small error.

Consequently, the second multiplier unit 108 in the embodiment of the present invention, which multiplies the second normal-phase input signal Vin1B and the second opposite-phase input, signal Vin1BX by the ratio of the feedback resistance value relative to the input resistance value, is capable of providing the ideal multiplication results as indicated in expression 1.

Figure 5:
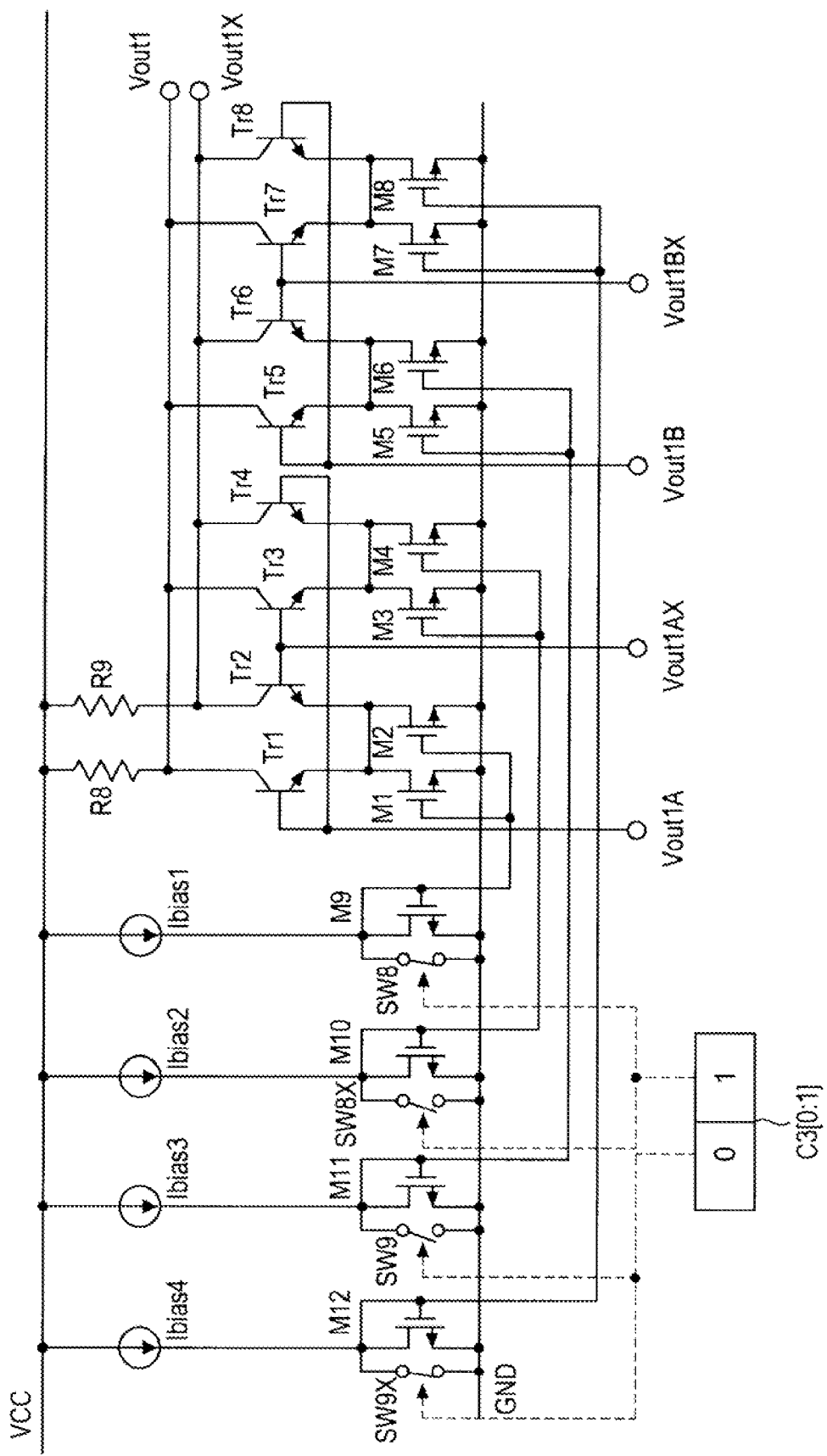
FIG. 5 is a circuit diagram presenting structural example that may be adopted in the adder/subtractor unit in an embodiment of the present invention.

Structure and Function of the Adder/Subtractor Unit Achieved in an Embodiment of the Present Invention FIG. 5 is a circuit diagram, showing a structural example that may be adopted in the adder/subtractor unit 110 in an embodiment of the present invention As shown in FIG. 5, the adder/subtractor unit 110 comprises a reference power line VCC, a ground GND, an emitter ground circuit that includes resistors R8 and R9, nMOS (negative metal oxide semiconductor) transistors M1~M8 and transistors Tr1~Tr8, switches SW 8, SW 8X, SW 9 and SW 9X by which the emitter ground circuit is engaged in operation, nMOS transistors M9~M12 and current sources Ibias1~Ibias 4. It is to be noted that while the structure in FIG. 8 includes the nMOS transistors M1~M12, the present invention is not limited to this example and the adder/subtractor unit may instead include pMOS (positive metal oxide semiconductor) transistors or the like.

The first normal-phase output signal Vout1A, the first opposite-phase output signal Vout1AX, the second normal-phase output signal Vout1B and the second opposite-phase output, signal Vout1BX are input to the emitter ground circuit. The emitter ground circuit outputs an output signal Vout1 corresponding to the state of the emitter ground circuit and an opposite-phase output signal VoutX1 having a phase shifted by 180° relative to the phase of the output signal Vout1. The output signal Vout1 is explained next.

As indicated in expressions 4 and 5, the first multiplier unit 104 and the second multiplier unit 108 both execute multiplication by using positive values as they each multiply the input signals by the ratio of the feedback resistance value relative to the input resistance value. Accordingly, if the target phase shift requires negative multiplication results such as Vin1×cos(150°)−Vin1×{−cos(30°)}=−0.8660×Vin1, the adder/subtractor unit 110 selects either the first normal-phase output signal Vout1A or the first opposite-phase output signal Vout1AX as a differential signal reference and selects either the second normal-phase output signal Vout1B or the second opposite-phase output signal Vout1BX as a differential signal reference based upon the third digital control signal C3 [0:1] so as to use negative multiplication results for the phase shift.

A digital signal $[01]_2$, corresponding to the phase shift quantity 150°, is input as the third digital control signal C3 [0:1] to the adder/subtractor unit 110 in FIG. 5. The switch SW 8 is turned ON/OFF based upon the value taken in the first bit of the third digital control signal C3 [0:1] and the switch SW 9 is turned ON/OFF based upon the value taken in the second bit of the third digital control signal C3 [0:1]. While the switch SW 8X is turned ON/OFF based upon the value taken in the first bit of the third digital control signal C3 [0:1] as is the switch SW 8, its ON/OFF state is the inverse of the ON/OFF state at the switch SW 8. Likewise, the ON/OFF state of the switch SW 9X is the inverse of the ON/OFF state at the switch SW 9.

It is to be noted that while the four switches are controlled based upon the two-bit third digital control signal C3 [0:1] in the example presented in FIG. 5, the present invention is not limited to this example and the individual switches may be controlled based upon a four-bit third digital control signal C3 [0:3] instead. In addition, it is obvious that the third digital control signal may be constituted of any number of bits.

At the adder/subtractor unit 110 in FIG. 5, the switches SW 8 and SW 9X are turned on and the switches SW 8X and SW 9 are turned off in response, to the third digital control signal C3 [0:1]. At this time, the nMOS transistors M3 and M4 connected on the emitter side of the transistors TR 3 and TR 4 and the nMOS transistors M5 and M6 connected on the emitter side of the transistors TR 5 and TR 6 are engaged in operation. The nMOS transistors M1 and M2 connected on the emitter side of the transistors TR 1 and TR 2 and the nMOS transistors M7 and M8 connected on the emitter side of the transistors TR 7 and TR 8, on the other hand, are not engaged in operation. Accordingly, an output signal Vout1−Vout1X, expressed as Vout1−Vout1X=C×{(Vout1AX−Vout1A)+(Vout1B−Vout1BX)}=C×{−(Vout1A−Vout1AX)+(Vout1B−Vout1BX)}, is output (C represents the amplitude).

For instance, when the input signal Vin1 undergoes a phase shift by the phase shift quantity 150°, the first term in expression 1, calculated as Vin1×cos(150°)=−Vin1×cos(30°)=−0.8660×Vin1, assumes a negative value. The second term in expression 1, calculated as A·sin(ωt)×sin(150°)=A·sin(ωt)×sin(30°)=0.5000×A·sin(ωt), assumes a positive value. As explained earlier, since the first multiplier unit 104 uses the ratio of the feedback resistance value relative to the input resistance value in the multiplication as indicated in expression 4, it executes multiplication by using positive values. Accordingly, the adder/subtractor unit 110 calculates the sum of the first opposite-phase output signal Vout1AX=Vin1×cos(210°)=−0.8660×Vin1, the phase of which is shifted by 180° relative to the phase of the first, normal-phase output signal Vout1A=Vin1×cos(30°)=0.8660×Vin1, selected as the differential signal reference, and the second normal-phase output signal Vout1B=A·sin(ωt)×sin(150°)=A·sin(ωt)×sin(30°)=0.5000×A·sin(ωt), selected as the differential signal reference, so as to shift the phase of the input signal Vin1 by the phase shift quantity 150°. Since the multiplication value used in the embodiment of the present invention is the ratio of the feedback resistance values relative to the input resistance value, the amplitude V in expression 1 is set to 1.000. However, it is obvious that the amplitude V may be set to any other value.

As described above, the adder/subtractor unit 110 selects either the first normal-phase output signal Vout1A or the first opposite-phase output, signal Vout1AX as the optimal differential signal reference and selects either the second normal-phase output signal Vout1B or the second opposite-phase output signal Vout1BX as the optimal differential signal reference based upon the third digital control signal C3 [0:1] and thus is able to execute the optimal operation, i.e., addition or subtraction. Consequently, the phase can be shifted by any shift quantity among the shift quantities corresponding to the phase shift, step settings shown in FIG. 2.

It is to be noted that while an explanation is given above in reference to the output signal Vout1, addition or subtraction can be executed in a similar manner for the opposite-phase output signal Vout1X having a phase shifted by 180° relative to the phase of the output signal Vout1.

As explained above, the first normal-phase output signal Vout1A, the first opposite-phase output signal Vout1AX, the second normal-phase output, signal Vout1B and the second opposite-phase output signal Vout1BX each indicate a multiplication value substantially equal to the ideal multiplication results calculated as expressed in expression 1. Consequently, the output signal Vout1 output from the adder/subtractor unit 110, and indicating the results of addition or subtraction executed in the adder/subtractor unit by using these multiplication values, is an output signal having undergone an ideal phase shift as expressed in expression 1.

As described above, the phase shifter 100 achieved in the embodiment of the present invention alters the value representing the ratio of the feedback, resistance value relative to the input resistance value used as the multiplication value in the first multiplier unit 104 and the second multiplier unit 108 based upon the first digital control signal C1 [0:N−1] and the second digital control signal C2 [0:N−1] and thus obtains ideal multiplication values as expressed in expression 1. Then, based upon the third digital control signal C3 [0:3], it executes addition or subtraction by using the multiplication result output from the first multiplier unit 104 and the multiplication result output from the second multiplier unit 108.

Thus, the phase shifter 100 in the embodiments of the present invention is able to execute a highly accurate ideal phase shift at all times, as expressed in expression 1, without manifesting a phase shift quantity error as phase shifters in the related art that use analog signals or digital signals tend to do.

(Phase Shift Method)

Next, the phase shift method adopted in the phase shifter in the embodiments of the present invention described above is explained in reference to FIG. 6.

Figure 6:
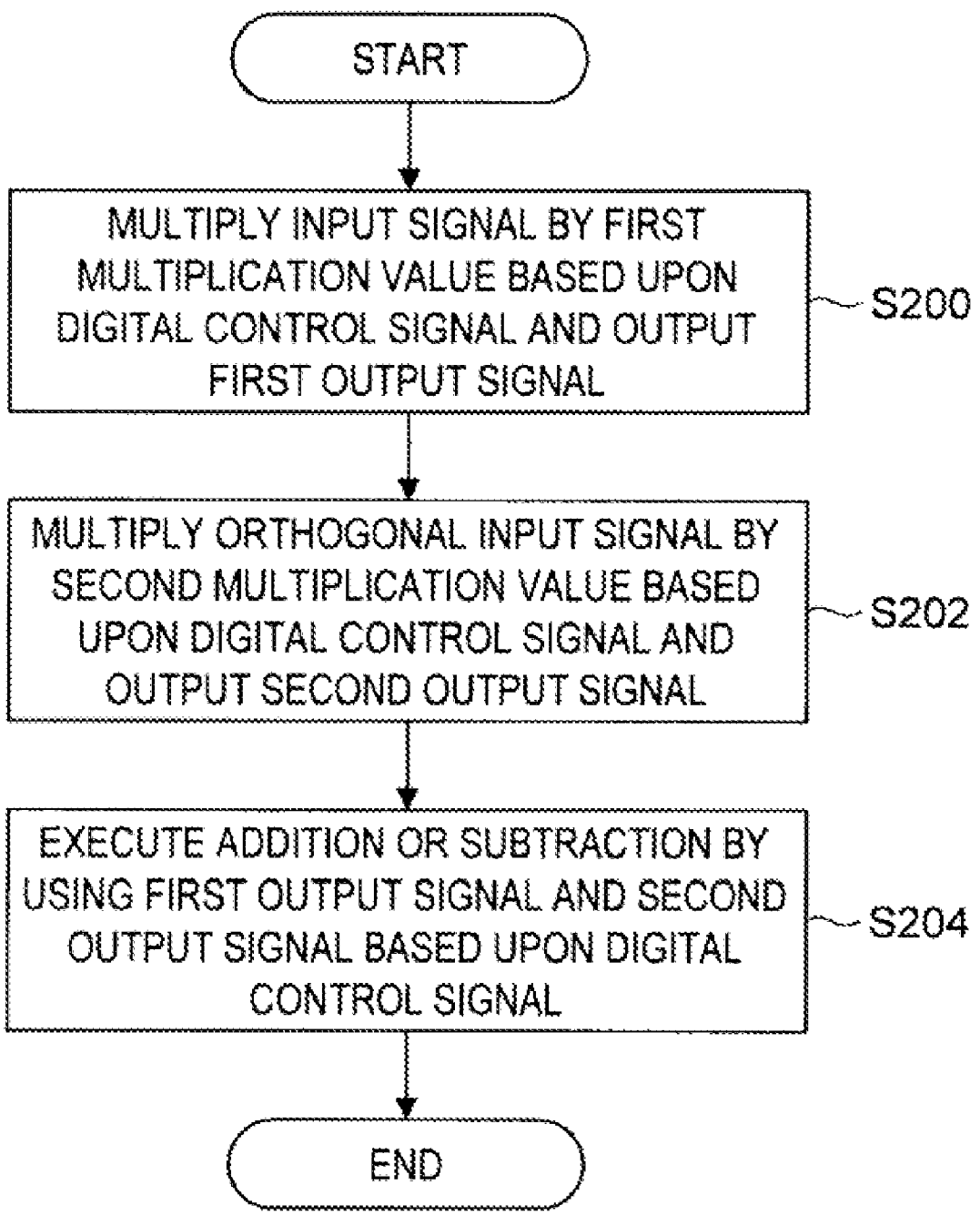
FIG. 6 presents a flowchart of the phase shift method adopted in the phase shifter in an embodiment of the present invention.

FIG. 6 presents a flowchart of the phase shift executed in the phase shifter in an embodiment of the present invention.

First, as an input signal to undergo the phase shift is input to the phase shifter, the phase shifter multiplies the input signal by a first multiplication value corresponding to the desired phase shift quantity based upon a digital control signal specifying the phase shift quantity by which the phase of the input signal is to be shifted (S 200). The first multiplication value used in this step is the ratio of the resistance values and thus, as long as the resistors used to calculate the resistance value ratio are manufactured through, for instance, a single manufacturing process, the characteristics of any inconsistency in the resistance values at the resistors used to calculate the resistance value ratio will be identical and thus, no error will manifest with regard to the multiplication value relative to the ideal value.

Based upon the digital control signal, the phase shifter multiplies an orthogonal input signal, having its phase shifted by 90° relative to the phase of the input signal, by a second multiplication value equivalent to the desired phase shift quantity (S 202). The second multiplication value used in this step is the ratio of the resistance values and thus, as long as the resistors used to calculate the resistance value ratio are manufactured through, for instance, a single manufacturing process, the characteristics of any inconsistency in the resistance values at the resistors used to calculate the resistance value ratio will be identical and thus, no error will manifest with regard to the multiplication value relative to the ideal value.

The phase shifter executes addition or subtraction (S 204) based upon the digital signal by using a first output signal output in step S 200 after multiplying the input signal by the first multiplication value and a second output signal output in step S 202 executed to multiply the orthogonal input signal by the second multiplication value. The phase shifter then outputs an output signal having its phase shifted relative to the phase of the input signal, resulting from the addition or subtraction executed by using the first output signal and the second output signal. The addition or the subtraction is executed by selecting either of the normal phase signal or the opposite-phase signal corresponding to the first output signal as a differential signal reference and selecting either the normal phase signal or the opposite-phase signal corresponding to the second output signal as a differential signal reference.

It is to be noted that since the addition or subtraction is executed in step S 204 by using the first output signal and the second output signal manifesting no error relative to the respective ideal values, the output signal provided from the phase shifter, too, is naturally free of error relative to the ideal value.

The phase shifter in the embodiments of the present invention shifts the phase of the input signal by adopting the phase shift method described above in reference to the flowchart. The phase shift method enables the phase shifter in the embodiments of the present invention to execute a highly accurate, ideal phase shift.

It will be understood by those skilled in the art that various modifications, combinations, sub-combinations and alterations are possible depending upon design requirements and other factors insofar as they are within the scope of the appended claims or the equivalent thereof.

For instance, the multiplier unit 104 in the embodiment of the present invention shown in FIG. 3 includes input resistors assuming a specific resistance value and a plurality of feedback resisters assuming different resistance values in correspondence to the individual phase shift steps so as to alter the value of the ratio of the feedback resistance value relative to the input resistance value. However, the multiplier unit in the embodiment of the present invention may adopt a structure other than this, and may include feedback resisters assuming a predetermined resistance value and a plurality of input resistors assuming different resistance values in correspondence to the individual phase shift steps. By selecting a specific input resistance value among the plurality of input resistance values, too, the ideal multiplication value can be output, as in the case of the multiplier unit 104 achieved in the embodiment of the present invention, as long as the values indicating the ratio of the feedback resistance value relative to the input resistance value correspond to the individual phase shift steps.

In addition, the multiplier unit 104 in the embodiment of the present invention shown in FIG. 3 includes a plurality of feedback resisters assuming different resistance values corresponding to the individual phase shift steps so that the value representing the ratio of the feedback resistance value relative to the input resistance value can be varied. However, the multiplier unit in the embodiment of the present invention may adopt a structure other than this and it may be constituted with, for instance, an element capable of altering the resistance value in response to a digital control signal.

Moreover, while the multiplier unit 104 in the embodiment of the present invention shown in FIG. 3 selects a specific feedback resistance value based upon the first digital control signal, the present invention is not limited to this example and a specific feedback resistance value among various feedback resistance values may be selected in response to an analog signal input thereto. The multiplier in the embodiment should be able to output the ideal multiplication value by selecting a specific feedback resistance value among different feedback resistance values based upon an analog signal input thereto as well, since the multiplication is still executed based upon the ratio of the feedback resistance value relative to the input resistance value.

It is obvious that, the variations described above may be adopted equally effectively in the multiplier unit 108 in the embodiment of the present invention shown in FIG. 4.

It should be understood that the structures described above can be conceived with ease by persons skilled in the art and that they fall within the scope of the appended claims of the present invention or the equivalent thereof.

What is claimed is:

1. A phase shifter, comprising:
a first multiplier unit receiving an input signal and a first digital control signal that specifies a phase shift quantity for the input signal and outputting a first output signal obtained by multiplying the input signal with a first multiplication value calculated by the first multiplier unit based upon the first digital control signal, wherein the first multiplier unit includes:
an operational amplifier;
an input resistor having a predetermined input resistance value; and
a feedback resistor at which a specific feedback resistance value is selected based upon the first digital control signal, the first multiplier unit calculating the first multiplication value by calculating a ratio of the feedback resistance value relative to the input resistance value based upon the first digital control signal;
a second multiplier unit receiving an orthogonal input signal having a phase perpendicular to a phase of the input signal and a second digital control signal that specifies the phase shift quantity, and outputting a second output signal obtained by multiplying the orthogonal input signal with a second multiplication value calculated by the second multiplier unit based upon the second digital control signal; and
an adder/subtractor unit that executes addition or subtraction by using the first output signal and the second output signal based upon a third digital control signal corresponding to the phase shift quantity.

2. A phase shifter according to claim 1, wherein the second multiplier unit includes:
an operational amplifier;
an input resistor having a predetermined input resistance value; and
a feedback resistor at which a specific feedback resistance value is selected based upon the second digital control signal, the second multiplier unit calculating the second multiplication value by calculating a ratio of the feedback resistance value relative to the input resistance value based upon the second digital control signal.

3. A phase shifter according to claim 2, wherein:
the first output signal includes a first normal-phase output signal and a first opposite-phase output signal used as a first differential signal;
the second output signal includes a second normal-phase output signal and a second opposite-phase output signal used as a second differential signal; and
the adder/subtractor unit executes addition or the subtraction of the first output signal and the second output signal based upon the third digital control signal by selecting either the first normal-phase output signal or the first opposite-phase output signal as the first differential signal reference so as to assume a normal phase or an inverse phase for the first output signal and selecting either the second normal-phase output signal or the second opposite-phase output signal as the second differential signal reference so as to assume a normal phase or an inverse phase for the second output signal.

4. A phase shifter according to claim 1, further comprising:
a control signal generation unit that outputs the first digital control signal, the second digital control signal and the third digital control signal based upon an input digital control signal indicating the phase shift quantity.

5. A phase shift method implemented by a phase shifter circuit, the method comprising:
receiving an input signal and an orthogonal input signal having a phase perpendicular to a phase of the input signal;
receiving a first digital control signal specifying a phase shift quantity for the input signal;
calculating, by using a multiplier unit of the chase shifter circuit, a first multiplication value based on the first digital control signal, the first multiplier unit including an operational amplifier, an input resistor having a predetermined input resistance value, and a feedback resistor at which a specific feedback resistance value is selected based on the first digital control signal, wherein the first multiplication value is calculated based on a ratio of the feedback resistance value relative to the predetermined input resistance value;
receiving a second digital control signal specifying the phase shift quantity;
multiplying the input signal with the first multiplication value;
multiplying the orthogonal input signal having a phase perpendicular to a phase of the input signal with a second multiplication value calculated based upon the second digital control signal; and
executing addition or subtraction with the phase shifter circuit and based upon a third digital control signal by using a first output signal resulting from the multiplication of the input signal and the first multiplication value, and a second output signal resulting from the multiplication of the orthogonal input signal and the second multiplication value.

6. A phase shifter, comprising:
a first multiplier unit receiving an input signal and a first digital control that specifies a phase shift quantity for the input signal and outputting a first output signal obtained by multiplying the input signal with a first multiplication value calculated based upon the first digital control signal, wherein the first output signal includes a first normal-phase output signal and a first opposite-phase output signal used as a first differential signal, the first multiplier unit including:
an operational amplifier;
an input resistor having a predetermined input resistance value; and
a feedback resistor at which a specific feedback resistance value is selected based upon the first digital control signal, the first multiplier unit calculating the first multiplication value by calculating a ratio of the feedback resistance value relative to the input resistance value based upon the first digital control signal;
a second multiplier unit receiving an orthogonal input signal having a phase perpendicular to a phase of the input signal and a second digital control signal that specifies the phase shift quantity and outputting a second output signal obtained by multiplying the orthogonal input signal with a second multiplication value based upon the second digital control signal, wherein the second output signal includes a second normal-phase output signal and a second opposite-phase output signal used as a second differential signal; and
an adder/subtractor unit that executes addition or subtraction by using the first output signal and the second output signal based upon a third digital control signal corresponding to the phase shift quantity, wherein the adder/subtractor unit executes addition or the subtraction of the first output signal and the second output signal based upon the third digital control signal by selecting either the first normal-phase output signal or the first opposite-phase output signal as the first differential signal reference so as to assume a normal phase or an inverse phase for the first output signal, and selecting either the second normal-phase output signal or the second opposite-phase output signal as the second differential signal reference so as to assume a normal phase or an inverse phase for the second output signal.

7. A phase shifter according to claim 6, wherein the second multiplier unit includes:
an operational amplifier;
an input resistor having a predetermined input resistance value; and
a feedback resistor at which a specific feedback resistance value is selected based upon the second digital control signal, the second multiplier unit calculating the second multiplication value by calculating a ratio of the feedback resistance value relative to the input resistance value based upon the second digital control signal.

8. A phase shifter according to claim 6, further comprising a control signal generation unit that outputs the first digital control signal, the second digital control signal and the third digital control signal based upon an input digital control signal indicating the phase shift quantity.

9. A phase shift method implemented by a phase shifter circuit, the method comprising:
receiving an input signal and an orthogonal input signal having a phase perpendicular to a phase of the input signal;
receiving a first digital control signal specifying a phase shift quantity for the input signal;
calculating, by using a multiplier unit of the phase shifter circuit, a first multiplication value based on the first digital control signal, the first multiplier unit including an operational amplifier, an input resistor having a predetermined input resistance value, and a feedback resistor at which a specific feedback resistance value is selected based on the first digital control signal, wherein the first multiplication value is calculated based on a ratio of the feedback resistance value relative to the predetermined input resistance value;

receiving a second digital control signal specifying the phase shift quantity;

generating a first output signal by multiplying the input signal with the first multiplication value, wherein the first output signal includes a first normal-phase output signal and a first opposite-phase output signal used as a first differential signal;

generating a second output signal by multiplying the orthogonal input signal with a second multiplication value calculated based upon the second digital control signal wherein the second output signal includes a second normal-phase output signal and a second opposite-phase output signal used as a second differential signal; and executing addition or subtraction by using the first output signal and the second output signal based upon a third digital control signal corresponding to the phase shift quantity, wherein the phase shifter circuit executes addition or the subtraction of the first output signal and the second output signal based upon the third digital control signal by selecting either the first normal-phase output signal or the first opposite-phase output signal as the first differential signal reference so as to assume a normal phase or an inverse phase for the first output signals and selecting either the second normal-phase output signal or the second opposite-phase output signal as the second differential signal reference so as to assume a normal phase or an inverse phase for the second output signal.

* * * * *